United States Patent
Hsu et al.

(10) Patent No.: US 6,617,702 B2
(45) Date of Patent: Sep. 9, 2003

(54) SEMICONDUCTOR DEVICE UTILIZING ALIGNMENT MARKS FOR GLOBALLY ALIGNING THE FRONT AND BACK SIDES OF A SEMICONDUCTOR SUBSTRATE

(75) Inventors: Louis L. Hsu, Fishkill, NY (US); Rajiv V. Joshi, Yorktown Heights, NY (US); Carl Radens, Langrangeville, NY (US); Jack A. Mandelman, Stormville, NY (US); Tsorng-Dih Yuan, Hopewell Junction, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/769,080

(22) Filed: Jan. 25, 2001

(65) Prior Publication Data

US 2002/0096359 A1 Jul. 25, 2002

(51) Int. Cl.$^7$ ............................................. H01L 23/544
(52) U.S. Cl. ..................... 257/797; 438/401; 438/462
(58) Field of Search ..................... 438/107, 109, 438/110, 113, 401, 462, 975; 257/570, 685, 686, 723, 724, 728, 797

(56) References Cited

U.S. PATENT DOCUMENTS 5,200,631 A * 4/1993 Austin et al. ................. 257/81
6,052,498 A 4/2000 Paniccia ....................... 385/14

FOREIGN PATENT DOCUMENTS

EP          8-861133       * 12/1998

* cited by examiner

Primary Examiner—David L. Talbott
Assistant Examiner—Alonzo Chambliss
(74) Attorney, Agent, or Firm—Dilworth & Barrese, LLP

(57) ABSTRACT

The present invention provides for globally aligning microelectronic circuit systems, such as communication devices and chips, fabricated on or bonded to the front and back sides of one or more substrates to provide for wireless communications between the circuit systems through the one or more substrates. In one embodiment, two circuit systems situated on opposite sides of a substrate are aligned to provide for wireless communications between the two circuit systems through the substrate. In another embodiment, communication devices situated on one or more substrates are aligned to provide for wireless communications between the communication devices through the one or more substrates. In another embodiment, two chips situated on opposite sides of a transparent substrate are aligned to provide for wireless communications between the two chips through the transparent substrate.

34 Claims, 8 Drawing Sheets

SEMICONDUCTOR DEVICE UTILIZING ALIGNMENT MARKS FOR GLOBALLY ALIGNING THE FRONT AND BACK SIDES OF A SEMICONDUCTOR SUBSTRATE

FIELD OF THE INVENTION

This invention relates to the field of integrated circuit (IC) design. In particular, it relates to a method and apparatus globally aligning the front and back sides of a substrate. Specifically, it relates to a method and apparatus globally aligning the front and back sides of a substrate to provide for wireless communications between circuit systems fabricated on or bonded to the substrate.

BACKGROUND OF THE INVENTION

It is understood that in order to achieve advanced computing systems, the integration of high-density digital, rf, optical, and memory components fabricated on different substrates needs to be realized. Problems arise in the interconnection of multiple substrates with specialized functionality with other substrates, and in the spatial registration of multiple substrates for localized optical interconnect of the multiple substrates. Several challenges in the packaging of high speed opto-electronic components must also be met, such as low cost, small package size, and high data rates.

The most difficult problems in interconnecting substrates are those associated with the transmitter and receiver modules, which require high precision laser fiber and detector fiber alignment to achieve high transfer to and from the fiber, respectively. Laser fiber alignment demands particularly stringent tolerances, and hence, adds appreciable cost to laser fiber module packaging.

Conventionally, a laser fiber module is fabricated first by fixing the laser chip to a suitable substrate, followed by activation of the laser. A fiber which is securely fastened to a suitable carrier is then positioned near the laser, and is moved in a search pattern until the maximum light power is coupled into it, as indicated by a detector placed at the far end of the fiber. The fiber is then secured to the substrate. This procedure is termed active alignment.

Active alignment is time consuming and relatively difficult; it increases the cost. Another approach with the promise of lower packaging cost is to avoid activating the laser. It is called passive alignment. A typical passive alignment technique is the flip chip solder bump technique. In this technique, solder-wettable pads are provided on the two surfaces to be bonded, with each pad on one of the surface being covered by the solder. It has been documented that solder bump flip chip assembly of LED has important advantages over traditional epoxy die attachment and wire bonding. The self-aligning feature of the solder bump reflow process have been demonstrated to result in an array alignment accuracy of one micron in both X and Y directions.

Typically, the preferred technique from the above-described alignment techniques is the passive flip chip solder bump technique. However, even with the solder bump technique, while in-plane positional accuracy can be realized, vertical positional accuracy, which relies on the control of the thickness of the deposited solder, cannot always be realized; since, vertical positional accuracy depends on the application.

The laser application technique is the most difficult. This is due to the more demanding positional accuracy required and the relatively small surface area of the laser chip does not permit the large number of large diameter solder bumps which guarantee reproducible precision in other applications. In light of these challenges, novel alignment methods are needed which overcome the difficulties and challenges of prior art alignment techniques.

SUMMARY

An aspect of the present invention is to provide a method and apparatus globally aligning circuit systems, such as communication devices and chips, fabricated on or bonded to the front and back sides of one or more substrates to provide for wireless communications between the circuit systems through the one or more substrates, where the method overcomes the disadvantages of prior art alignment techniques.

In accordance with the above aspect of the present invention, the present disclosure provides several embodiments of alignment methods and packages formed for globally aligning and providing wireless communications between circuit systems fabricated on or bonded to one or more substrates. In one embodiment, two circuit systems situated on opposite sides of a substrate are aligned to provide for wireless communications between the two circuit systems through the substrate.

In another embodiment, communication devices situated on one or more substrates are aligned to provide for wireless communications between the communication devices through the one or more substrates.

Still, in another embodiment, two chips situated on opposite sides of a transparent substrate are aligned to provide for wireless communications between the two chips through the transparent substrate.

DETAILED DESCRIPTION OF THE INVENTION

The present disclosure provides several embodiments of alignment methods and devices formed therefrom for globally aligning and providing wireless communications between circuit systems, such as communication devices and chips, fabricated on or bonded to one or more substrates. It is appreciated that other non-disclosed embodiments can be designed which are within the scope of the present disclosure.

The present invention provides several unique features to realize the integration of circuit systems having the same or different operational formats as an integrated package. Two such features include (1) the alignment of top and bottom circuit systems for the purpose of enabling wired or wireless communications (e.g., optical, laser, IR, RF, etc.) between the opposing circuit systems; and (2) processing on both sides of the one or more substrates so that the circuit systems and metal interconnects do not suffer from thermal incompatibility. The circuit systems could be, for example, a transmitter, a receiver, a transceiver, a CPU, a memory array, a logic circuitry chip, an analog or mixed signal system, CDMA circuitry, and other communication circuitry.

With reference to FIGS. 1–9, there are shown cross-sectional views illustrating a process according to the present invention for globally aligning two circuit systems on opposite sides of a substrate to provide for wireless communications between the two circuit systems through the substrate. The circuit systems can have identical operational formats, e.g., both circuit systems are analog or digital, or the circuit systems can have different operational formats, e.g., one circuit system is analog and the other circuit system is digital, one circuit system is optical and the other circuit system is analog, etc.

Figure 1:
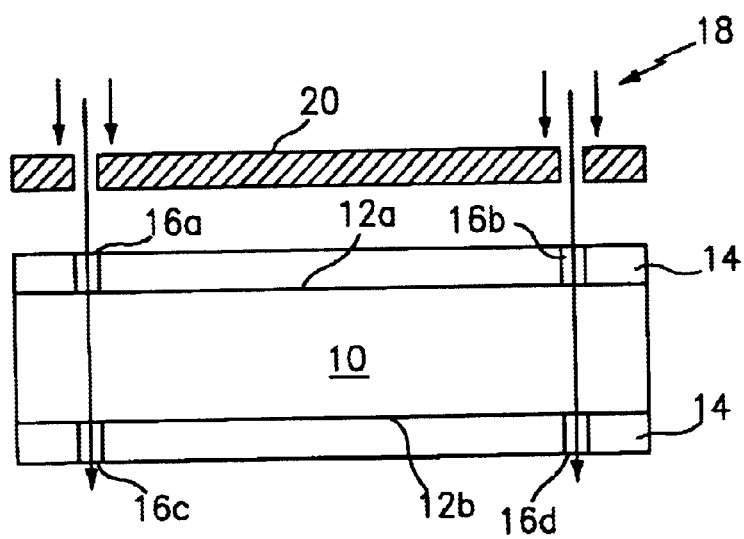
FIGS. 1–9 are cross-sectional views illustrating a process for globally aligning two circuit systems on opposite sides of a substrate to provide for wireless communications between the two circuit systems through the substrate according to the present invention.
Figure 2:
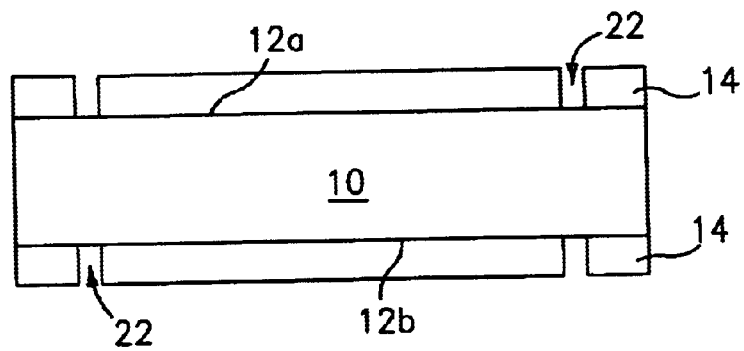
Figure 3:
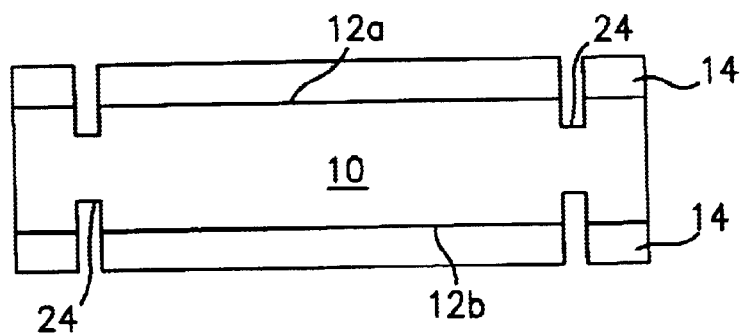

In particular, FIGS. 1–9 illustrate process steps for fabricating a chip package with on-chip IR transceivers, transmitters and/or receivers. A semiconductor substrate 10 with good surface quality on both sides 12a, 12b is coated with photo-sensitive photoresist 14. Alignment patterns 16a–16d are then formed by x-ray or IR irradiation 18 using a mask 20 (FIG. 1). The exposure is done on one side perpendicular to the substrate 10 so that the photoresist 14 is exposed on both sides of the substrate 10 in a perfectly aligned position to concurrently form an aligned pattern 22 on both sides of the substrate 10 (FIG. 2). Once the photoresist 14 is developed, a dry etch, or wet etch, is carried out to concurrently form global alignment marks 24 on both sides 12a, 12b for front and back chip alignment purposes (FIG. 3).

In the illustrated example, the IR transceivers will be built inside the etched areas of the etched pattern 22. However, it is contemplated that the IR transceivers can be built in other areas of the substrate 10, and the etched areas 22 may be used for the lithographic alignment of subsequent photo-masking levels.

Figure 4:
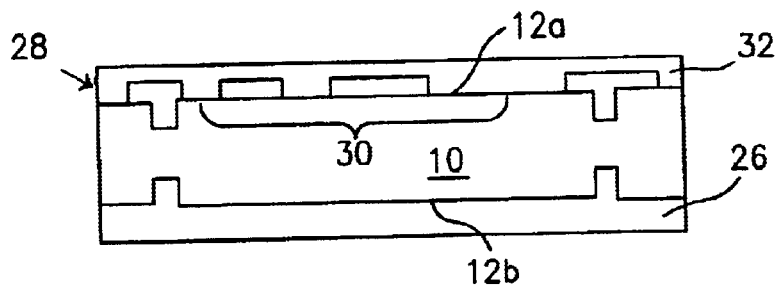

With reference to FIG. 4, the bottom side 12b of the substrate 10 is protected with a layer of protective coating 26, such as oxide and/or nitride. A first circuit system 28 is built on the top side 12a of the substrate 10 using the global alignment marks 24 as reference points. The first circuit system 28 includes microelectronic/optoelectronic communication devices 30. The surface is passivated with a thick layer of dielectric. After a chem-mech polish, the surface is coated with a layer of CVD nitride 32 for protection purposes.

Figure 5:
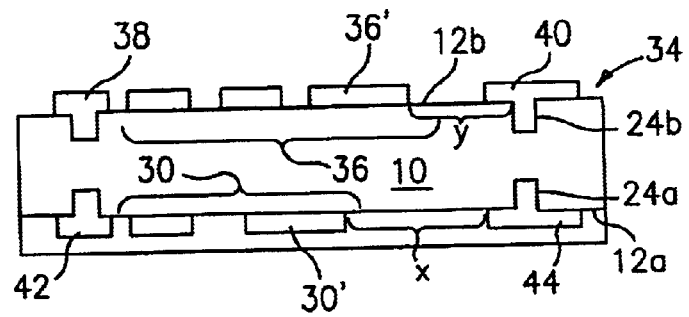

With reference to FIG. 5, a second circuit system 34 is then built on the bottom side 12b of the substrate 10, after the protective coating 26 is removed and the substrate 10 is flipped. The second circuit system 34 also includes microelectronic/optoelectronic communication devices 36. Again, while building the second circuit system 34, the global alignment marks 24 are used as reference points. For example, if a communication device 30' is placed at a first predetermined distance "X" from a global alignment mark 24a on the top side 12a, then a respective communication device 36' must be placed at a second predetermined distance "Y" from a global alignment mark 24b aligned with the global alignment mark 24a, such that the chip is optimally fabricated.

Figure 6:
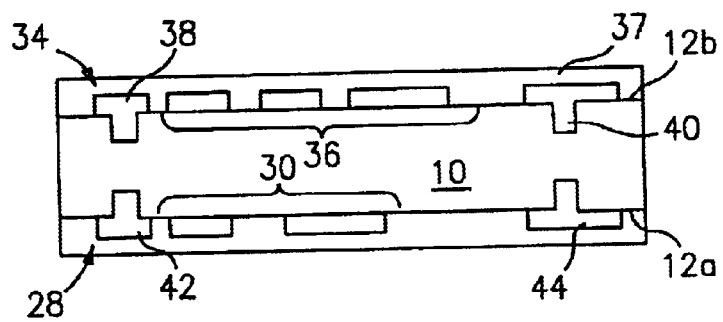

The surface is then passivated with a thick layer of dielectric. After a chem-mech polish, the surface is coated with a layer of CVD nitride 37 for protection purposes (FIG. 6). It is noted that devices 38, 40, 42, 44 are IR transceivers, and therefore, these devices are also communication devices.

Figure 7:
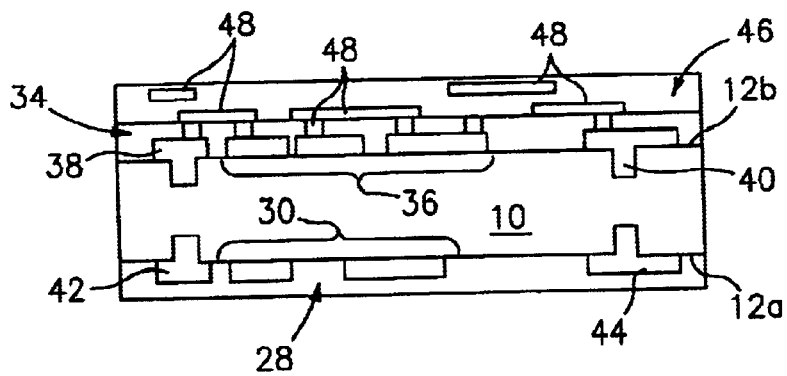

The microelectronic/optoelectronic communication devices 36 which include IR transceivers 38, 40 on the back side of the chip can now be interconnected, since after the front-end processing of the chip, the temperature of the chip is generally below 350 to 400 degrees Celsius. The microelectronic/optoelectronic communication devices 36 which include IR transceivers 38, 40 are interconnected by forming an interconnection structure 46 having several different sized interconnections 48 as shown by FIG. 7.

Figure 8:
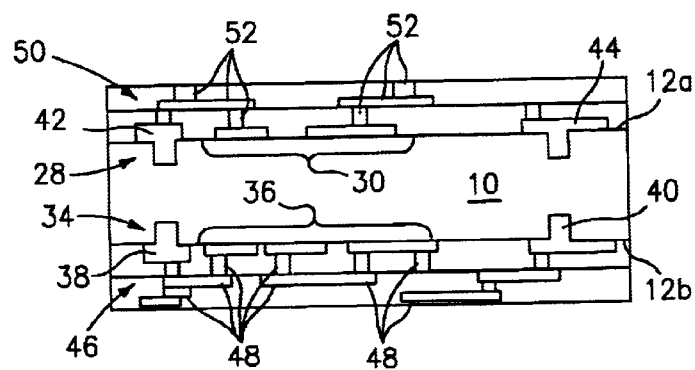

After the interconnection structure 46 on the back side of the chip is completed, or partially completed, a similar interconnection structure 50 can then be built on the front side of the chip. The interconnection structure 50 provides several different sized interconnections 52 for interconnecting the communication devices 30 which include IR transceivers 42, 44 on the front side of the chip as shown by FIG. 8. Preferably, both front and back sides 12a, 12b of the chip are processed in a thermal compatible sequence with minimal manufacturing cost.

Figure 9:
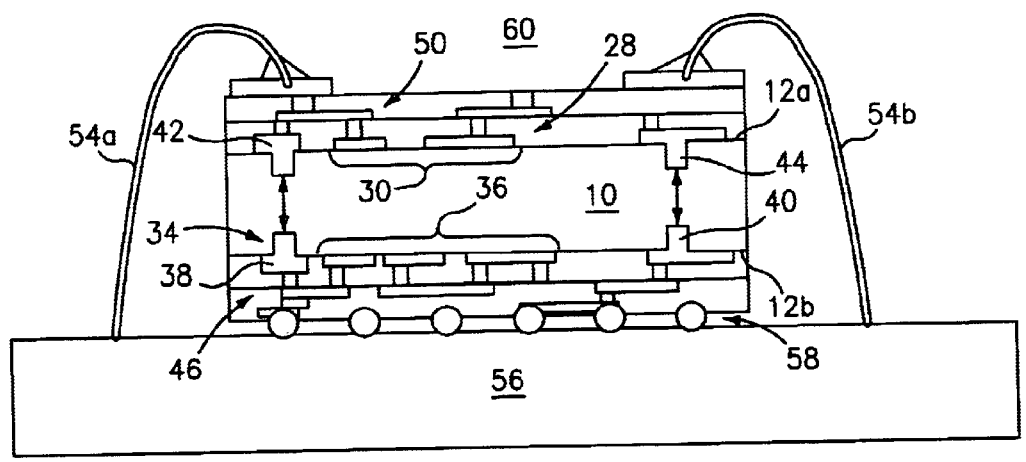

Once both sides of the chip have been finished, there may be several ways to package the chip. One preferred example is shown by FIG. 9. The top (or bottom) side is wire-bonded using two wires 54a, 54b to a substrate 56, while the bottom (or top) side is C4 bonded using a C4 bonding structure 58 to the same substrate 56. Accordingly, a chip package 60 is provided having first and second circuit systems 28, 34 capable of communicating with each other as shown by the arrows.

The advantages offered by the above fabrication process and fabricated chip using the global alignment process include the ability to provide the global alignment marks 24 on the front and back sides of the substrate 10 for subsequent packaging with registration between the substrates 10, 56; the integration of optical transceiver functionality (emitters, detectors, modulators, etc.) onto the substrate 10 using microelectronics fabrication; and the ability to package the substrates 10, 56 in proximity to each other with registration provided by the global interconnect.

A description will now be provided with reference to FIGS. 10–13 of a process for globally aligning communication devices on opposite sides of one or more substrates to provide for wireless communications between the communication devices through the one or more substrates.

Figure 10:
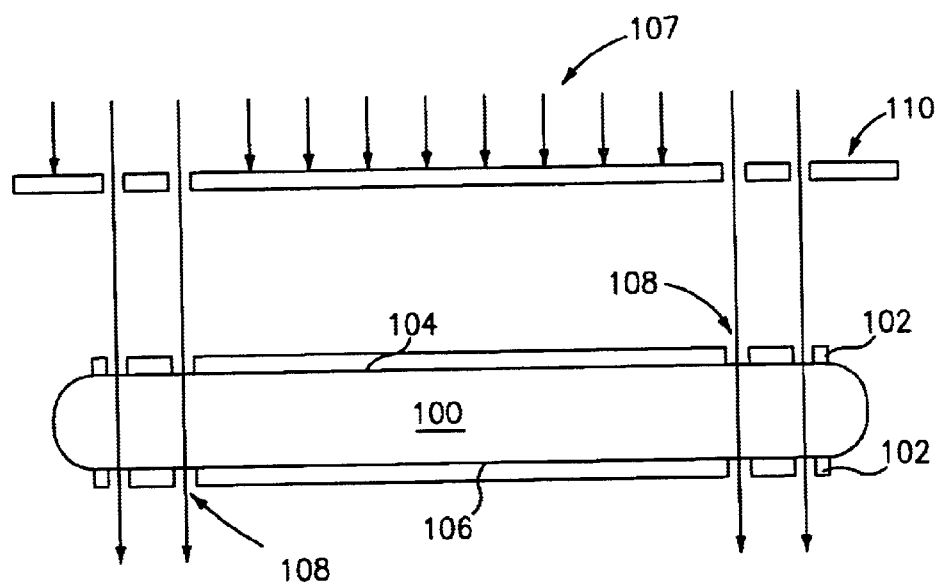
FIGS. 10–13 are cross-sectional views illustrating a process for globally aligning communication devices on opposite sides of one or more substrates to provide for wireless communications between the communication devices through the one or more substrates according to the present invention.

With reference to FIG. 10, a substrate 100 is coated with a photoresist 102 on the front and back sides 104, 106. Then, using a mask 110, the substrate 100 is exposed to x-rays or IR irradiation 107 to concurrently form an aligned pattern 108 on the front and back sides 104, 106 of the substrate 100. The exposure is done on one side perpendicular to the substrate 100 so that the photoresist 102 is exposed on both sides of the substrate 100 in a perfectly aligned position to concurrently form the aligned pattern 108 on both sides of the substrate 100.

Figure 11:
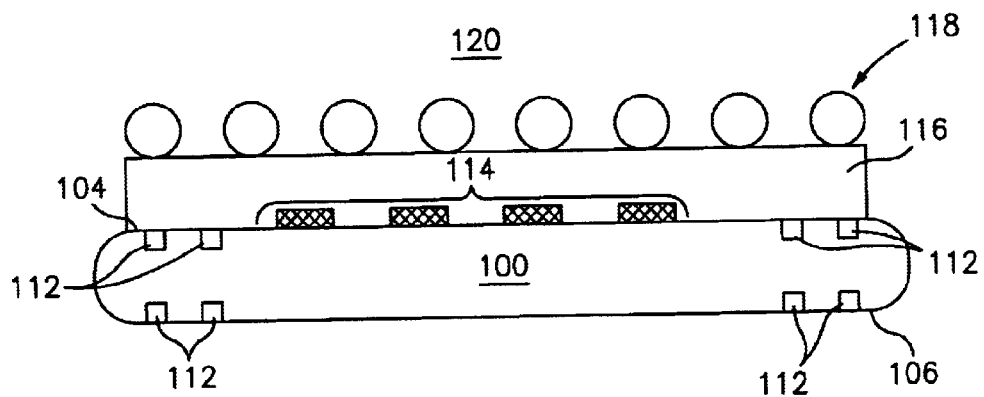

With reference to FIG. 11, once the photoresist 102 is developed, a dry etch, or wet etch, is carried out to concurrently form global alignment marks 112 on both sides 104, 106 for front and back chip alignment purposes. The photoresist 102 in the front and back sides 104, 106 of the substrate 100 are then removed. Microelectronic/optoelectronic communication devices 114, such as substrate emitter and detector devices, IR devices, and optical transceiver devices, are then provided, preferably, by bonding, on the front side 104 of the substrate 100 using the global alignment marks 112 as reference points.

The surface is then passivated with a thick layer of dielectric. After a chem-mech polish, the surface is coated with a layer of CVD nitride 116 for protection purposes, before providing a wire bonding structure 118 to complete a package 120 containing communication devices therein. Conventional IC fabrication techniques are used for integrating digital, analog, RF, optical or other microelectronics functionality and interconnections onto the substrate 100.

The same procedure, as described with reference to FIG. 11 for the front side 104, can be performed for the back side 106 to provide a package with microelectronic/optoelectronic communication devices 114 on both sides 104, 106. Accordingly, this type of package can then provide wireless communications between the communication devices 114 on the front and back sides 104, 106 through the substrate 100.

Figure 12:
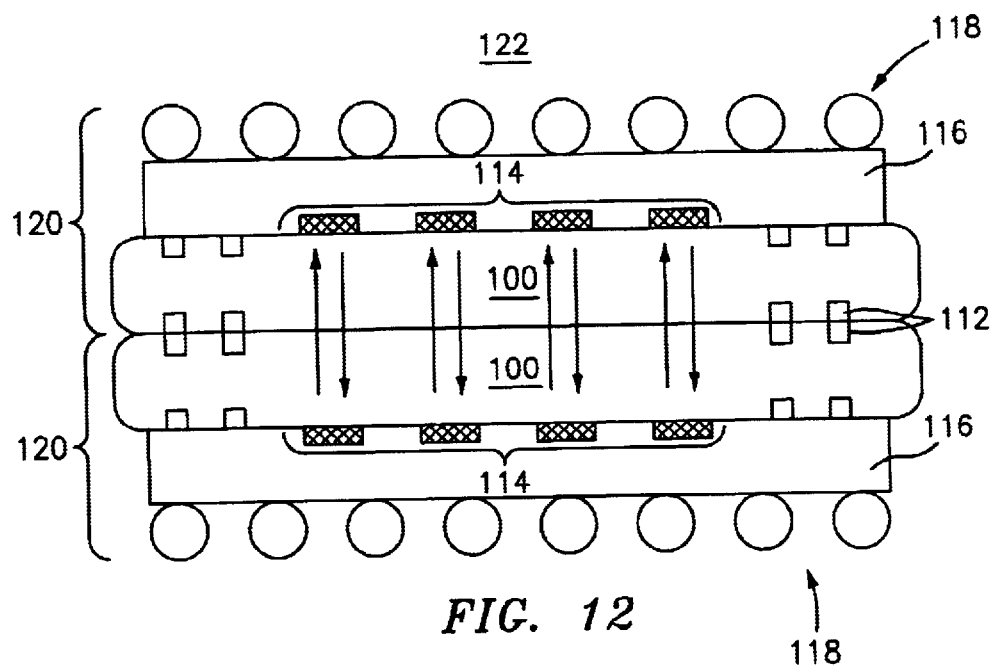

With reference to FIG. 12, it is provided that two packages 120 fabricated with the process described above with reference to FIGS. 10 and 11, can be combined by globally aligning the global alignment marks 112 on each package 120 to provide a dual-substrate package 122. In package 122, the communication devices 114 of each package 120 can then wirelessly communicate with each other (as indicated by the arrows) via the two globally aligned substrates 100. The global alignment marks 112 can also be used to physically register the two or more substrates 100 relative to each other.

Figure 13:
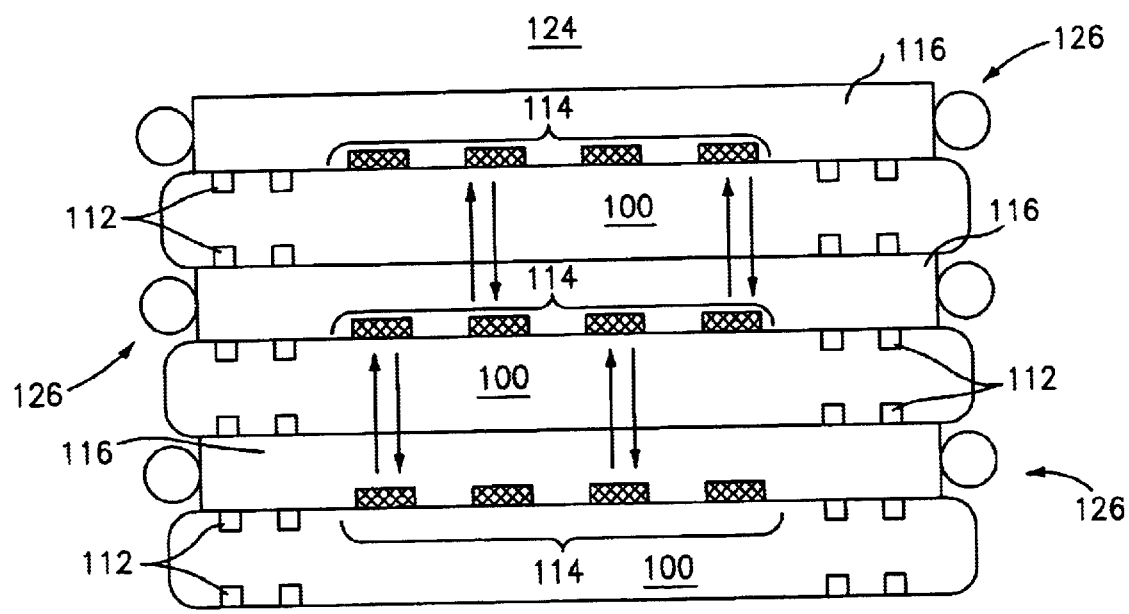

With reference to FIG. 13, a package 124 can be provided, by the process described above for making package 120, where a plurality of substrates 100 are globally aligned relative to each other by the global alignment marks 112. Only one side of each substrate 100 is provided with communication devices 114, such that the communication devices 114 are staggered relative to each other. A wire bonding structure 126 is provided adjacent each layer of CVD nitride 116.

It is appreciated that one or more of the communication devices 114 in each of the packages, i.e., packages 120, 122, 124, may be replaced by a circuit system as described above with reference to FIGS. 1–9.

In package 124, the communication devices 114 can then wirelessly communicate with each other (as indicated by the arrows) via the plurality of globally aligned substrates 100. The global alignment marks 112 can also be used to physically register the plurality of substrates 100 relative to each other.

Figure 14:
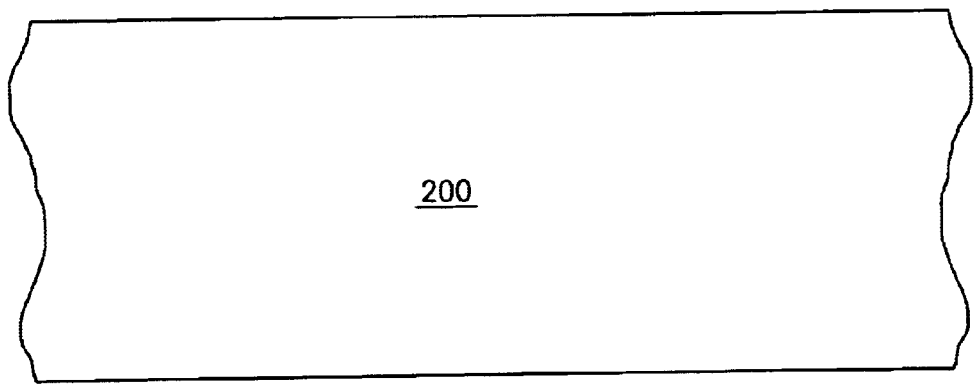
FIGS. 14–19 are cross-sectional views illustrating a process for globally aligning two chips on opposite sides of a transparent substrate to provide for wireless communications between the two chips through the transparent substrate according to the present invention.
Figure 15:
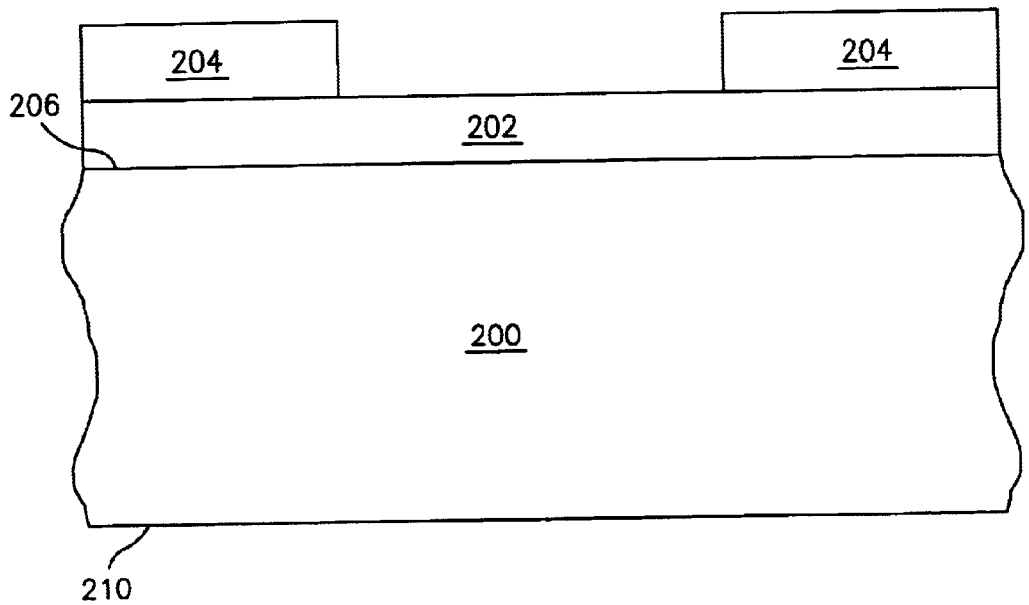

A description will now be provided with reference to FIGS. 14–19 of a process for globally aligning two chips on opposite sides of a transparent substrate to provide for wireless communications between the two chips through the transparent substrate. With reference to FIG. 14, a transparent substrate 200 is shown. An opaque layer 202 is provided to one side 206 of the transparent substrate 200 and a photoresist 204 is added to portions of the opaque layer 202, as shown by FIG. 15.

Figure 16:
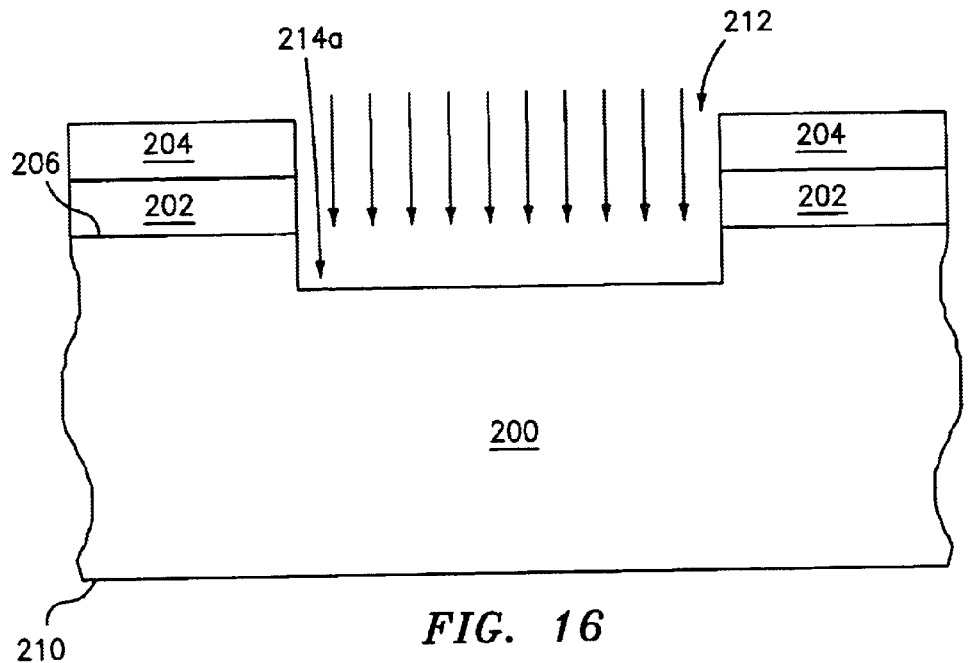

With reference to FIG. 16, the opaque layer 202 on the top side 206 of the transparent substrate 200 is then patterned by exposing the opaque layer 202 to x-ray or IR irradiation 212. The top side 206 of the substrate 200 is then etched to form a global alignment mark 214a.

Figure 17:
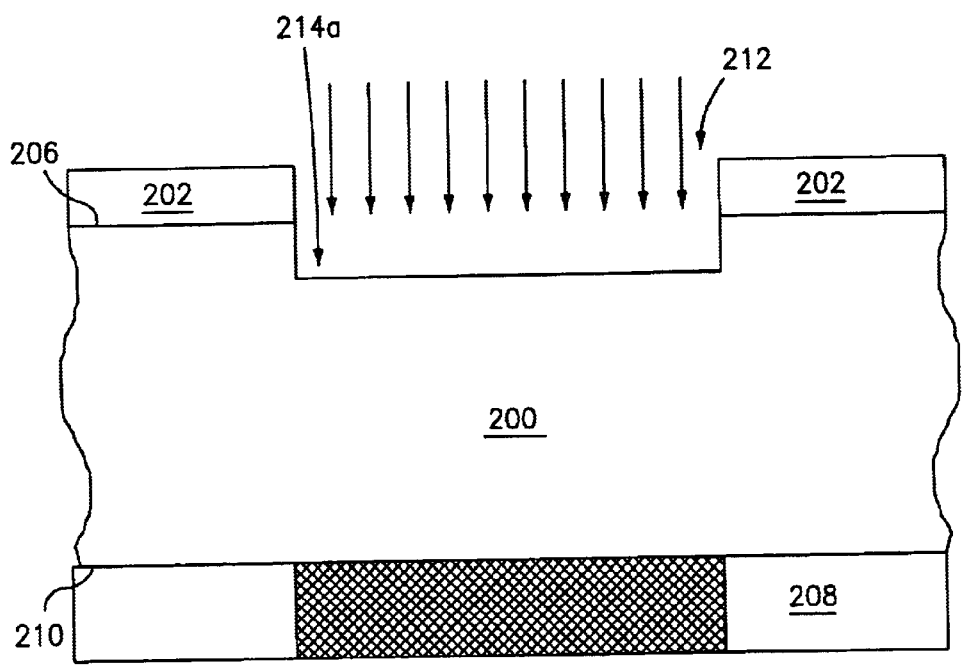
Figure 18:
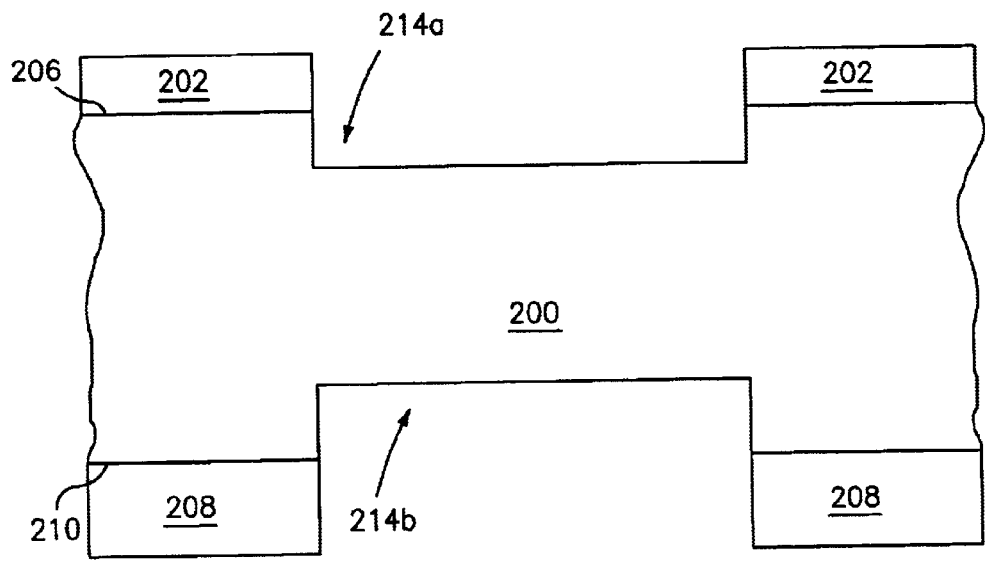

With reference to FIG. 17, the photoresist 204 from the top side of the substrate 200 is then removed and photoresist 208 is added to the bottom side 210 of the substrate 200. The top side 206 of the substrate is then exposed to x-ray or IR radiation 212 which causes the photoresist 208 on the bottom side 210 of the substrate 200 to be exposed to the irradiation 212 as well (as shown by the blackened photoresist on the bottom side 210). It is noted that the patterned opaque layer on the top side 206 of the transparent substrate 200 acts as a mask for exposing the photoresist 208 on the bottom side of the substrate 200. With reference to FIG. 18, the bottom side 210 of the substrate 200 is then etched to form a global alignment mark 214b which is aligned with the global alignment mark 214a.

Figure 19:
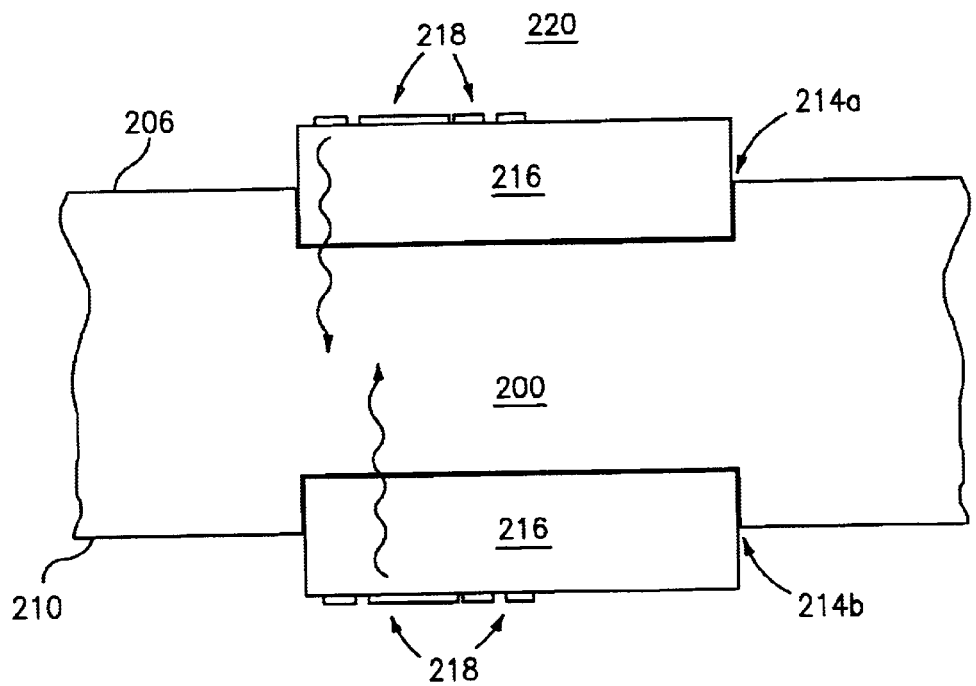

With reference to FIG. 19, chips or IC packages 216 having microelectronic/optoelectronic communication devices 218, such as IR transmitters, IR receivers, and IR transceivers, are then placed and, preferably, bonded to the transparent substrate 200 to provide a package 220. Registration for globally aligning the chips 216 with respect to each other is provided by the global alignment marks 214a, 214b. The chips 216 can then wirelessly communicate with each other via the transparent substrate 200 as shown by the wiggly arrows.

The chips 216 can have identical operational formats, e.g., both chips 216 are analog, both chips 216 are digital, both chips 216 are optical, etc., or the chips 216 can have different operational formats, e.g., one chip 216 is analog and the other chip 216 is digital, one chip 216 is optical and the other chip 216 is analog, etc. It can be appreciated that more than one global alignment mark 214 is formed on each side of the substrate 200 and that more than one chip 216 can be provided on each side of the substrate 200 and globally aligned with a respective chip 216 on the opposite side of the substrate 200.

What has been described herein is merely illustrative of the application of the principles of the present invention. Other arrangements and methods may be implemented by those skilled in the art without departing from the scope and spirit of this invention.

We claim:

1. A microelectronic system comprising at least one package having:
   at least one substrate having aligned global alignment marks formed in said at least one substrate by a photoresist having an alignment pattern irradiated on opposing surfaces of the at least one substrate; and
   first and second circuit system opposing surfaces of the at least one substrate, each of said first and second circuit systems having means for wirelessly communicating with each other through said at least one substrate, wherein said first and second systems are aligned via said global alignment marks.

2. The microelectronic system according to claim 1, wherein the first and second circuit systems have identical operational formats.

3. The microelectronic system according to claim 1, wherein the first and second circuit systems have different operational formats.

4. The microelectronic system according to claim 1, wherein the at least one substrate is transparent.

5. The microelectronic system according to claim 1, wherein the first and second circuit systems are one of a communication device and a chip.

6. The microelectronic system according to claim 1, wherein the first and second circuit systems are fabricated on the at least one substrate.

7. The microelectronic system according to claim 1, wherein the first and second circuit systems are bonded to the at least one substrate.

8. The microelectronic system according to claim 1, wherein the package is fabricated by an alignment process which includes the step of:
   providing a photoresist on a top and bottom side of a substrate of said at least one substrate;
   irradiating said photoresist from at least one side of said substrate to form the alignment pattern on said top and bottom side of said substrate;
   etching said alignment pattern to form said global alignment marks on said top and bottom sides of said substrate; and
   providing at least one communication device on one side of said substrate using at least one global alignment mark as a reference point.

9. The microelectronic system according to claim 1, wherein the first and second circuit systems include first and second interconnection structures for interconnecting components of the first and second circuit systems, respectively.

10. The microelectronic system according to claim 8, wherein the first and second interconnection structures are connected to the at least one substrate.

11. The microelectronic system according to claim 1, wherein the at least one substrate is aligned via said global alignment marks for aligning a substrate of the at least one substrate with global alignment marks of another substrate.

12. The microelectronic system according to claim 1, wherein the circuitry package is fabricated by an alignment process which includes the steps of:
   providing an opaque layer on one side of a substrate of said at least one substrate;
   providing a photoresist on said opaque layer on one side of said substrate;
   irradiating said photoresist from at least the one side of said substrate to form a first alignment pattern of said alignment pattern on said one side of said substrate;
   etching said first alignment pattern to form a first set of global alignment marks of said global alignment marks on said one side of said substrate;
   providing a photoresist on the other side of said at least one substrate;
   irradiating said first alignment pattern from at least the one side of said substrate to form a second alignment pattern of said alignment patter on the other side of said substrate;
   etching said second alignment pattern to form a second set of global alignment marks of said global alignment marks on the other side of said substrate, wherein the first and second sets of global alignment marks align with respect to each other; and
   providing at least one communication device on said one side of said substrate using at least one global alignment mark from the first and second sets of global alignment marks as a reference point.

13. The microelectronic system according to claim 1, wherein a substrate of said at least one substrate has a first set of global alignment marks on a top surface of the substrate and a second set of global alignment marks discrete from and aligned with the first set of global alignment marks, on the bottom surface of the substrate.

14. The microelectronic system according to claim 13, wherein the first set of global alignment marks and the second set of global alignment marks are formed substantially simultaneously.

15. The microelectronic system according to claim 1, wherein a first and second substrate of the at least one substrate are in surface to surface contact.

16. The microelectronic system according to claim 1, wherein the first and second circuit systems are positioned on top and bottom surfaces, respectively, of a substrate of the at least one substrate.

17. The microelectronic system according to claim 16, wherein the first and second circuit systems are separated by a distance that is less than the distance between the top and bottom surface of the substrate.

18. A circuitry package comprising:
   at least one substrate having aligned global alignment marks formed in said at least one substrate by a photoresist having an alignment pattern irradiated on opposing surfaces of the at least one substrate; and
   first and second circuit systems opposing surfaces of the at least one substrate, each of said systems having means for wirelessly communicating with each other through said at least one substrate, wherein said first and second systems are aligned via said global alignment marks for facilitating said wireless communication.

19. The circuitry package according to claim 18, wherein the first and second circuit systems have identical operational formats.

20. The circuitry package according to claim 18, wherein the first and second circuit systems have different operational formats.

21. The circuitry package according to claim 18, wherein the at least one substrate is transparent.

22. The circuitry package according to claim 18, wherein the first and second circuit systems are one of a communication device and a chip.

23. The circuitry package according to claim 18, wherein the first and second circuit systems are fabricated on the at least one substrate.

24. The circuitry package according to claim 18, wherein the first and second circuit systems are bonded to the at least one substrate.

25. The circuitry package according to claim 18, wherein the package is fabricated by an alignment process which includes the step of:
   providing a photoresist on a top and bottom side of a substrate of said at least one substrate;
   irradiating said photoresist from at least one side of said substrate to form the alignment pattern on said top and bottom side of said substrate;
   etching said alignment pattern to form said global alignment marks on said top and bottom sides of said substrate; and
   providing at least one communication device on one side of said substrate using at least one global alignment mark as a reference point.

26. The circuitry package according to claim 18, wherein the first and second circuit systems include first and second interconnection structures for interconnecting components of the first and second circuit systems, respectively.

27. The circuitry package according to claim 26, wherein the first and second interconnection structures are connected to the at least one substrate.

28. The circuitry package according to claim 18, wherein the at least one substrate is aligned via said global alignment marks for aligning the a substrate of the at least one substrate with global alignment marks of another substrate.

29. The circuitry package according to claim 18, wherein the circuitry package is fabricated by an alignment process which includes the steps of:
   providing an opaque layer on one side of a substrate of said at least one substrate;

providing a photoresist on said opaque layer on one side of said substrate;

irradiating said photoresist from at least the one side of said substrate to form a first alignment pattern on said one side of said substrate;

etching said first alignment pattern of said alignment pattern to form a first set of global alignment marks of said global alignment marks on said one side of said substrate;

providing a photoresist on the other side of said substrate;

irradiating said first alignment pattern from at lest the one side of said substrate to from a second alignment pattern on the other side of said substrate;

etching said second alignment pattern to from a second set of global alignment marks of said global alignment marks on the other side of said substrate, wherein the first and second sets of global alignment marks align with respect to each other; and providing at least one communication device on said one side of said substrate using at least one global alignment mark from the first and second sets of global alignment marks as a reference point.

30. The circuitry package according to claim 18, wherein a substrate of said at least one substrate has a first set of global alignment marks on a top surface of the substrate and a second set of global alignment marks discrete from and aligned with the first set of global alignment marks on the bottom surface of the substrate.

31. The circuitry package according to claim 18, wherein the first set of global alignment marks and the second set of global alignment marks are formed substantially simultaneously.

32. The circuitry package according to claim 31, wherein a first and second substrate of the at leapt one substrate are in surface to surface contact.

33. The circuitry package according to claim 18, wherein the first and second circuit systems are positioned on top and bottom surfaces, respectively, of a substrate of the at least one substrate.

34. The circuitry package according to claim 33, wherein the first and second circuit systems are separated by a distance that is less than the distance between the top and bottom surfaces of the substrate.

* * * * *